(12) United States Patent
Jiang et al.

(10) Patent No.: US 6,831,584 B2
(45) Date of Patent: Dec. 14, 2004

(54) HIGH-SPEED LOW-DISTORTION ANALOG-TO DIGITAL CONVERTER

(75) Inventors: Xicheng Jiang, Irvine, CA (US); Zhengyu Wang, Los Angeles, CA (US); Frank Chang, Los Angeles, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/645,924

(22) Filed: Aug. 22, 2003

(65) Prior Publication Data

US 2004/0041721 A1 Mar. 4, 2004

Related U.S. Application Data

(60) Provisional application No. 60/407,312, filed on Sep. 3, 2002.

(51) Int. Cl.[7] .................................................. H03M 1/12
(52) U.S. Cl. ........................................ 341/155; 341/158
(58) Field of Search .............................. 341/155, 154, 341/161, 122, 135, 136, 138, 158

(56) References Cited

U.S. PATENT DOCUMENTS

| | | | | |
|---|---|---|---|---|
| 4,176,344 A | * | 11/1979 | Saari et al. .................... 341/119 |
| 4,229,729 A | * | 10/1980 | Devendorf et al. ........... 341/159 |
| 4,521,765 A | * | 6/1985 | Wang et al. .................. 341/154 |
| 5,157,397 A | * | 10/1992 | Vernon ......................... 341/159 |
| 6,169,510 B1 | * | 1/2001 | Bult et al. .................... 341/155 |
| 6,246,258 B1 | * | 6/2001 | Lesea ............................ 326/39 |
| 6,285,308 B1 | * | 9/2001 | Thies et al. .................. 341/155 |
| 6,369,743 B2 | * | 4/2002 | Ono .............................. 341/159 |
| 6,373,420 B1 | * | 4/2002 | Harada ......................... 341/155 |
| 6,621,649 B1 | * | 9/2003 | Jiang et al. ................... 360/67 |
| 6,650,267 B2 | * | 11/2003 | Bult et al. .................... 341/155 |
| 6,664,910 B1 | * | 12/2003 | Mulder et al. ............... 341/158 |
| 6,710,734 B2 | * | 3/2004 | Ono et al. .................... 341/159 |

OTHER PUBLICATIONS

Singer, L. et al., "*A 12b 65MSample/s CMOS ADC with 82dB SFDR at 120 Mhz*", ISSCC 2000, Session 2, Nyquist–Rate Data Converters, Paper MP 2.3, pp. 38–39, IEEE.

Kattman, K. et al., "*A Technique for Reducing Differential Non–Linearity Errors in Flash A/D Converters*", ISSCC 91, Session 10, High–Speed Data Acquisition, Paper TP 10.4, pp. 170–171, IEEE.

Bult, K. et al., "*A 170mW 10b 50Msample/s CMOS ADC in 1 mm$^2$*", SSCC 97, Session 8, Data Converters, Paper FA 8.3; pp. 136–137, IEEE.

(List continued on next page.)

Primary Examiner—Peguy JeanPierre
(74) Attorney, Agent, or Firm—Sterne, Kessler, Goldstein & Fox, PLLC

(57) ABSTRACT

An analog to digital converter includes an array of differential input amplifiers. Each amplifier inputs an input voltage and a corresponding voltage reference, and outputs a differential signal representing a comparison of the input voltage and the corresponding voltage reference. A plurality of latches stores the differential signal from each of the differential input amplifiers. A decoder converts the stored differential signals to N-bit digital output. A first interface amplifier is connected to a first edge amplifier of the array through a first cross point. A second interface amplifier is connected to a second edge amplifier of the array through a second cross point. The first interface amplifier and the second interface amplifier are connected to each other through a third cross point.

14 Claims, 10 Drawing Sheets

OTHER PUBLICATIONS

Geelen, G., "*A 6b 1.1GSample/s CMOS A/D Converter*", ISSCC 2001, Session 8, Nyquist ADCs, Paper 8.2, pp 128–129, IEEE.

Choi, M. et al., "*A 6b 1.3GSample/s A/D Converter in 0.35μm CMOS*", ISSCC 2001, Session 8, Nyquist ADCs, Paper 8.1, pp. 126–127, IEEE.

Scholtens, P. "*A 6b 1.6GSample/s Flash ADC in 0.18μm CMOS using Averaging Termination*", ISSCC 2002, Session 10, High–Speed ADCs, Paper 10.2, pp. 68–69, IEEE.

International Search Report from PCT Appl. No. PCT/US03/27521, 5 pages, mailed Jan. 12, 2004.

* cited by examiner

HIGH-SPEED LOW-DISTORTION ANALOG-TO DIGITAL CONVERTER

CROSS-REFERENCE TO RELATED APPLICATIONS

This application claims priority to commonly assigned U.S. Provisional Patent Application No. 60/407,312, filed on Sep. 3, 2002, which is incorporated by reference herein.

BACKGROUND OF THE INVENTION

FIELD OF THE INVENTION

Applications such as disk drive read channels, fiber optical receivers, front end and data communication links using multi-level signaling (e.g. PAM and QAM) require high speed analog-to-digital converters (ADCs). It is of particular interest that such ADCs be fabricated in a standard CMOS technology. The main challenges in ADC performance are as follows: static and dynamic offset, low supply operation, design trade-offs between power, speed and chip area, time interleaving, gain-bandwidth optimization, high-speed input signal feed through and interpolation.

FIG. 1 shows a generic, conventional analog-to-digital converter. As shown in FIG. 1, the conventional analog-to-digital converter includes a resistor ladder 104 comprised of equal resistors R, an amplifier array 101, a corresponding array of latches 102, and a decode circuit 103.

The transistor performance in 0.18 $\mu$m CMOS process is ruled by threshold mismatch. Averaging, proposed by Kattman and Barrow, see "A Technique for Reducing Differential Nonlinearity Errors in Flash A/D Converters," *ISSCC Digest of Technical Papers*, pp. 170–171, February. 1991, is a proven technique to reduce offsets of the amplifiers array. See also K. Bult, A. Buchwald et al., "A 170 mW 10b 50 MSample/s CMOS ADC in 1 mm$^2$," *ISSCC Digest of Technical Papers*, pp. 136–137, February. 1997; H. Pan, et al., "A 12b 65 MSample/s CMOS ADC with 82 dB SFDR at 120 MHz," *ISSCC Digest of Technical Papers*, pp. 38–39, February. 2000; M. Choi, A. A. Abidi, "A 6b 1.3 GSample/s A/D Converter in 0.35 $\mu$m CMOS," *ISSCC Digest of Technical Papers*, pp. 126–127, February. 2001; and P. Scholtens and M. Vertregt, "A 6b 1.6 GSamples/s ADC in 0.18 $\mu$m CMOS Using Averaging Termination," *ISSCC Digest of Technical Papers*, pp. 168–169, February. 2002, which are incorporated by reference herein. However, an effective method to fix the boundary bending caused by offset averaging needs to be developed.

In general, there are two issues at the boundaries of the averaging network. First, the zero crossing points drift from the input reference voltage level due to the symmetrical nature is destroyed at the boundaries. This cause systematic non-linearity error. FIG. 2 illustrates zero-crossing shift versus amplifier position. Amplifier 101A is a "left edge" amplifier (see top portion of FIG. 2.) the zero crossings at the edges shift from their ideal values, causing distortion and nonlinearity. However, as may be seen from the middle portion of FIG. 2, the zero crossings in the center of the array 101 are located at the "ideal" position.

Additionally, the bottom portion of FIG. 2 shows another distorting edge effect, which is referred to as "offset distribution." As may be seen from the figure, the closer to the edge of the array 101 one gets, the greater the offset distribution, resulting in additional nonlinearity.

Thus, the downstream averaging network collects fewer random components for averaging at the boundaries. This causes less differential nonlinearity/integral nonlinearity (DNL/INL) improvement. State-of-the-art ADCs either use a partial of the amplifier array as dummies to preserve the electrical behavior of an infinite array of amplifiers (see, e.g., K. Bult, A. Buchwald et al., supra and H. Pan, et al., supra), or use a termination method to suppress the zero-crossing shifts at the edge (see P. Scholtens and M. Vertregt, supra). The termination method can effectively restore the systematic error when $R_0 < 3R_1$, namely the averaging window is narrow and boundary issue is not serious. Yet the edges with termination have less averaging.

For the dummy approach (i.e., adding additional "dummy" amplifiers at the edges of array 101), the wider the averaging window, the more dummies are needed. For example, M. Choi, A. A. Abidi, indicate that 18 dummies are needed for an averaging window covering 18 amplifiers. Furthermore, the more dummy amplifiers that are added to the array 101, the greater the reduction in voltage headroom available for the analog-to-digital conversion, and the greater the power consumption of the ADC. For low voltage operation, this becomes unacceptable.

SUMMARY OF THE INVENTION

The present invention is directed to a high-speed analog-to-digital converter with low distortion that substantially obviates one or more of the problems and disadvantages of the related art.

There is provided an analog to digital converter including an array of differential input amplifiers. Each amplifier inputs an input voltage and a corresponding voltage reference, and outputs a differential signal representing a comparison of the input voltage and the corresponding voltage reference. A plurality of latches store the differential signal from each of the differential input amplifiers. A decoder converts the stored differential signals to N-bit digital output. A first interface amplifier is connected to a first edge amplifier of the array through a first cross point. A second interface amplifier is connected to a second edge amplifier of the array through a second cross point. The first interface amplifier and the second interface amplifier are connected to each other through a third cross point.

In another aspect there is provided an analog to digital converter including a reference ladder with a plurality of resistors and taps providing voltage references. At least one controllable current source in series with each tap adjusts the voltage reference of each tap. An array of differential input amplifiers, where each amplifier inputs an input voltage and a corresponding voltage reference, and outputs a differential signal representing a comparison of the input voltage and the corresponding voltage reference. A plurality of latches store the differential signal from each of the differential input amplifiers. A decoder converts the stored differential signals to N-bit digital output.

Additional features and advantages of the invention will be set forth in the description that follows, and in part will be apparent from the description, or may be learned by practice of the invention. The advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incor- In the drawings.

DETAILED DESCRIPTION OF THE INVENTION

Reference will now be made in detail to the embodiments of the present invention, examples of which are illustrated in the accompanying drawings.

Figure 1:
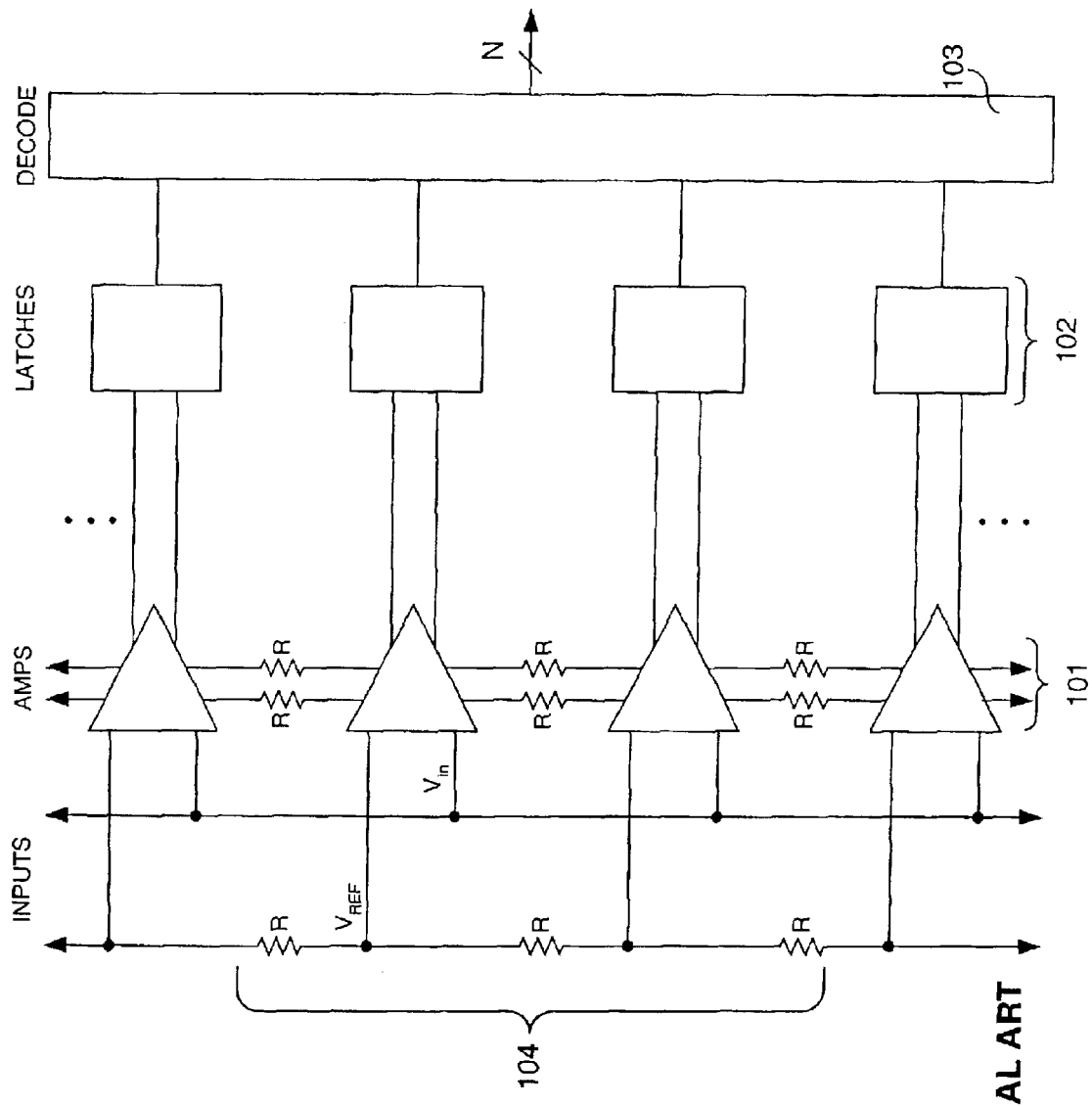
FIG. 1 illustrates a conventional analog-to-digital converter.
Figure 3:
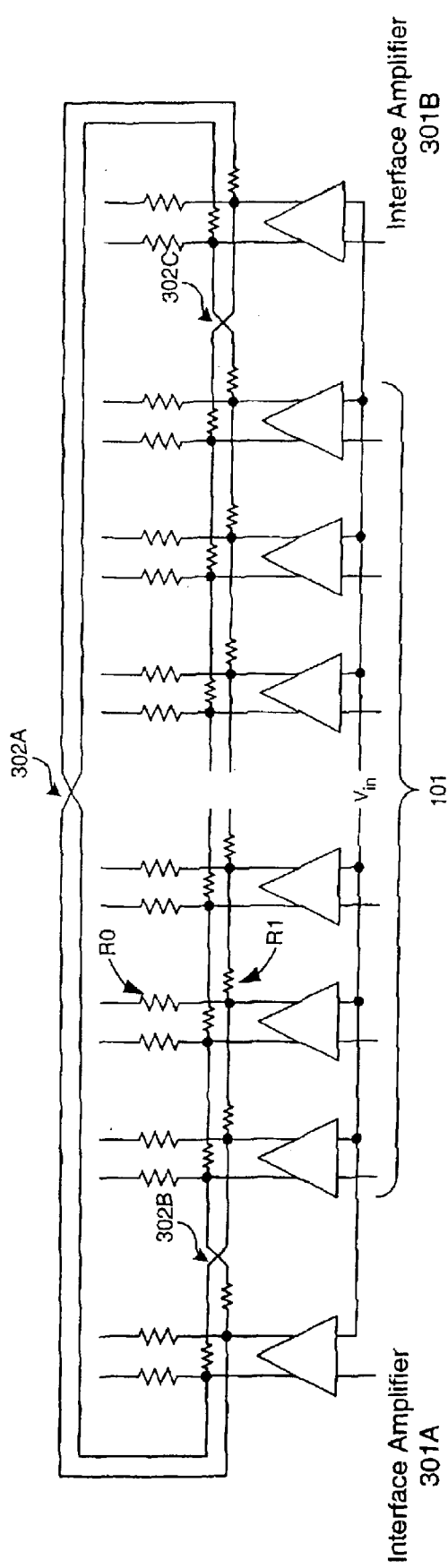
FIG. 3 illustrates an embodiment of the present invention using a triple cross connection.

FIG. 3 illustrates an amplifier array of an analog-to-digital converter according to the present invention. As may be seen in FIG. 3, the amplifier array includes a plurality of amplifiers 101 (amplifier array 101), similar to FIG. 1. The outputs of the amplifier array 101 are fed to a resistor network comprising resistors R0 and R1, as shown in the figure (the latches and decoder of FIG. 1 are not shown for clarity). In addition to the amplifier array 101, on the edges of the amplifier array 101 there are two interface amplifiers 301A and 301B, as shown in the figure. The interface amplifiers 301A, 301B replace the dummy amplifiers of conventional analog-to-digital converter circuits. The interface amplifiers 301A, 301B are connected to the amplifier array 101 through two cross-points 302B, 302C, and to each other through a cross-point 302A, as shown in FIG. 3. This circuit allows the elimination of the dummy amplifiers on each edge of conventional amplifier arrays, dramatically reducing power consumption, and substantially solving the voltage headroom problem.

Figure 2:
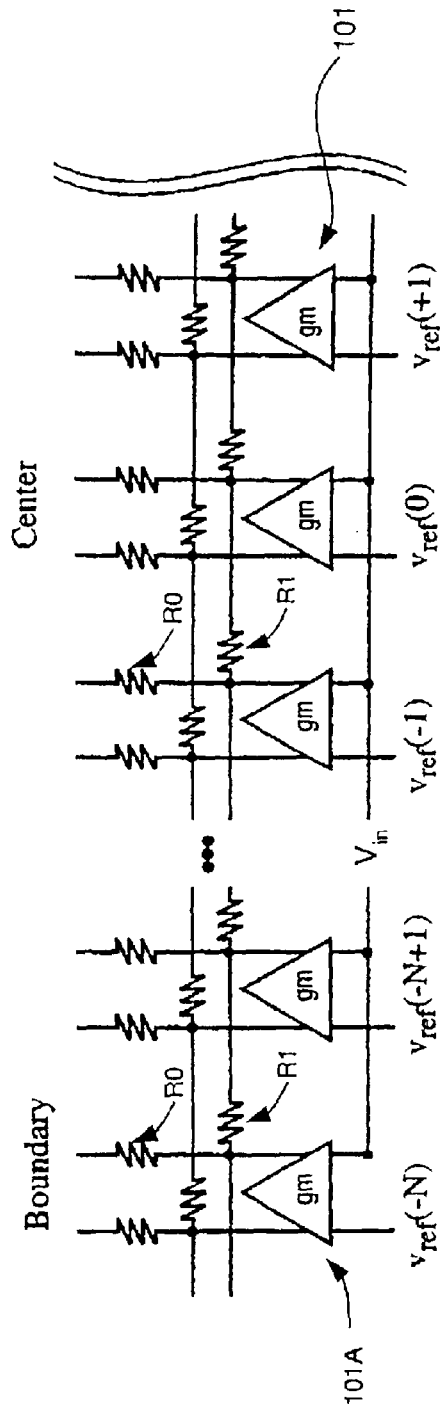
FIG. 2 is a graphic illustration of the problems inherent with the conventional analog-to-digital converter.
Figure 2:
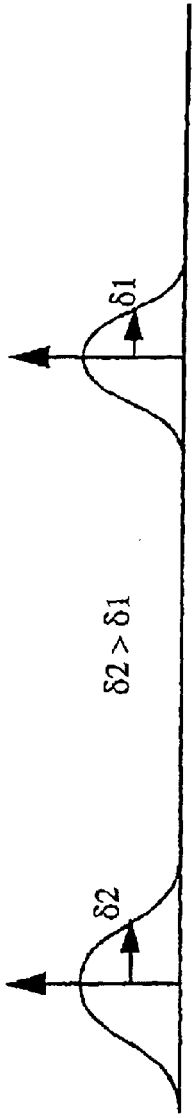
Figures 4A, 4B:
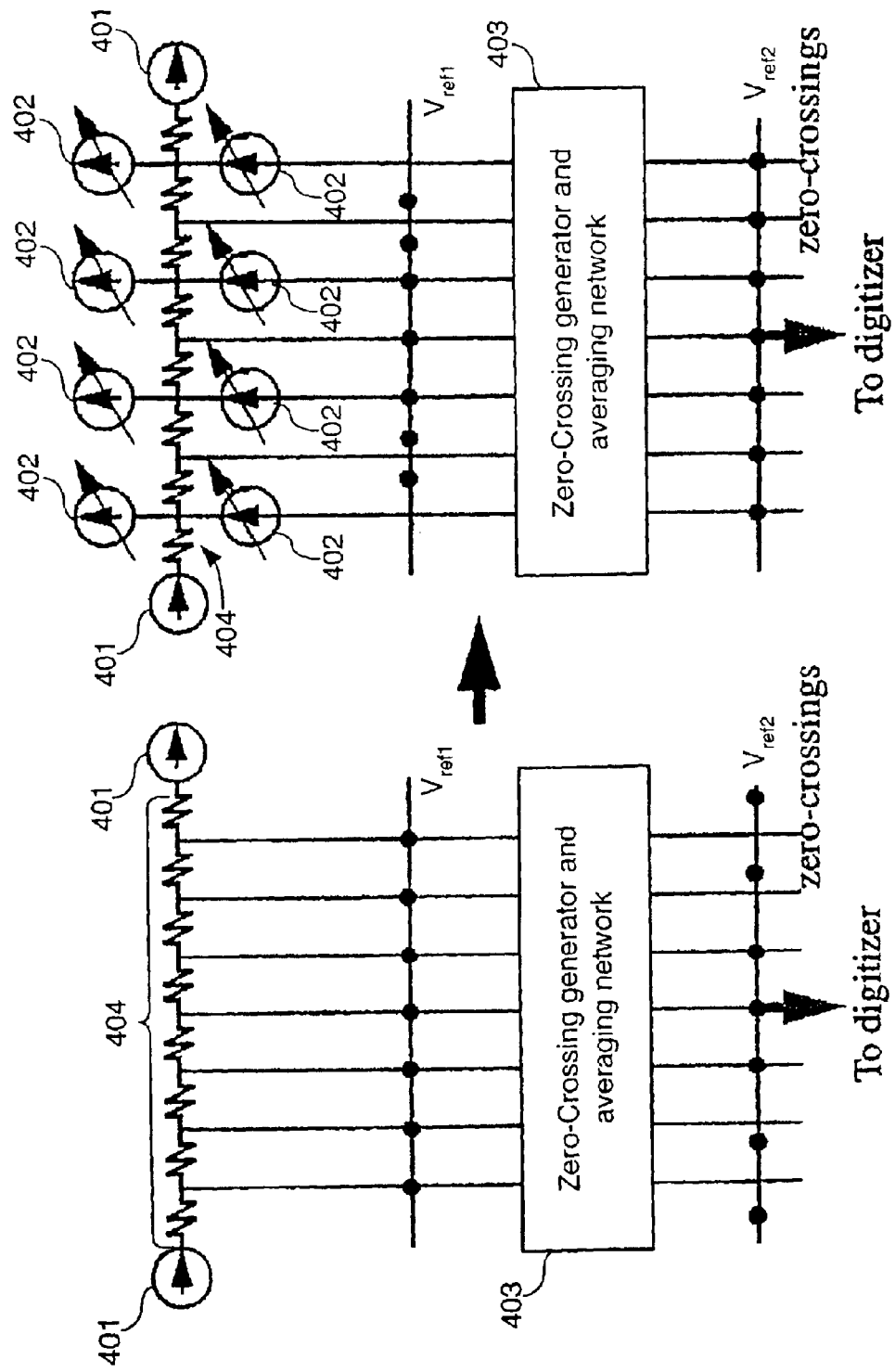
FIG. 4A illustrates the problem of shifting of reference voltage values in a conventional voltage reference ladder.
FIG. 4B illustrates the use of programmable current sources to remedy reference voltage distortion.

FIG. 4A illustrates the problem of reference voltage shift from a reference ladder 404. As shown in FIG. 4A, conventional analog-to-digital converter circuits include a reference ladder 404, with two current sources 401 on each side of the reference ladder 404, and taps leading to a zero crossing generator and averaging network 403. (Note that the "dots" at the $V_{REF1}$ and $V_{REF2}$ lines illustrate the shift in the zero crossing points that occurs due to the edge effect, as described above, and not two wires being connected together). As shown in FIG. 4A, and as discussed above with reference to FIG. 2, the zero crossing point shifts further and further from its ideal position as one gets closer to the edge of the amplifier array 101.

As an alternative, reference voltages can be pre-distorted to compensate for the zero-crossing shifts at the array boundary. The reference voltage is usually generated by a constant current flow through a resistor ladder 404. Since it is difficult to change the resistor values, the current flowing through resistor taps can be programmed instead, as shown in FIG. 4B.

FIG. 4B illustrates a solution to the problem of reference voltage shifts. As may be seen from FIG. 4B, in addition to the constant current sources 401, each tap from the reference ladder 404 includes two programmable current sources 402. Thus, through the use of programmable current sources 402, the reference ladder taps at the $V_{REF1}$ can be shifted back to their ideal positions at $V_{REF2}$. In other words, $V_{REF1}$ is predistorted to shift $V_{REF2}$ to its ideal position. Programmable current sources are well known in the art, and any number of circuits may be used. Furthermore, the programmable current sources 402 can be controlled through the use of relatively simple control logic, and may be reprogrammed "on the fly." Thus, through the use of programmable current sources 402, there is no longer a need for expensive trimming of resistors in the reference ladder 404, particularly since it is not so much the absolute values of the resistors that matter, but their values relative to each other.

The triple cross-connection averaging arrangement of FIG. 3, and the use of pre-distortion of the reference voltages (FIG. 4B) can maintain even averaging for a wide averaging window. The later method helps to relax the strict requirement of interface amplifiers 301A, 301B in the triple cross-connection averaging scheme of FIG. 3. The translational symmetry for the impulse response is maintained through triple cross-connections 302A, 302B, 302C, forming a circular resistor network. The input linear region of the transconductance (interface) amplifiers 301A, 301B should be wide enough to cover one edge of the original amplifiers array 101. The transconductance (interface) amplifiers 301A, 301B should satisfy:

$$g_{m,int}^2 \cdot h^2(1) \cdot \frac{1}{W_{int}L_{int}} = \sum_{n=-N}^{-1} g_m^2(n) \cdot h^2(n) \cdot \frac{1}{WL},$$

where $g_{m,int}$, $W_{int}$ and $L_{int}$ are the transconductance, transistor width and length of the interface amplifier 301, $g_m$, W and L correspond to original amplifier array 101, and h(n) is the impulse response of the post-amplifier resistor network (comprised of R0, R1, see FIG. 3). This ensures a good integral non-linearity/differential non-linearity (INL/DNL) enhancement in the full range.

For the reference voltages, biasing currents for the interface amplifiers 301A, 301B are determined such that output zero-crossings of amplifier array 101 are as even as possible. The remaining nonlinearity can be remedied by a digitally controlled reference voltage of FIG. 4B. The reference voltages are traditionally tapped from a resistor ladder 404. The subtractors use these reference voltages to generate zero-crossings for a digitizer to make decisions.

Figure 5:
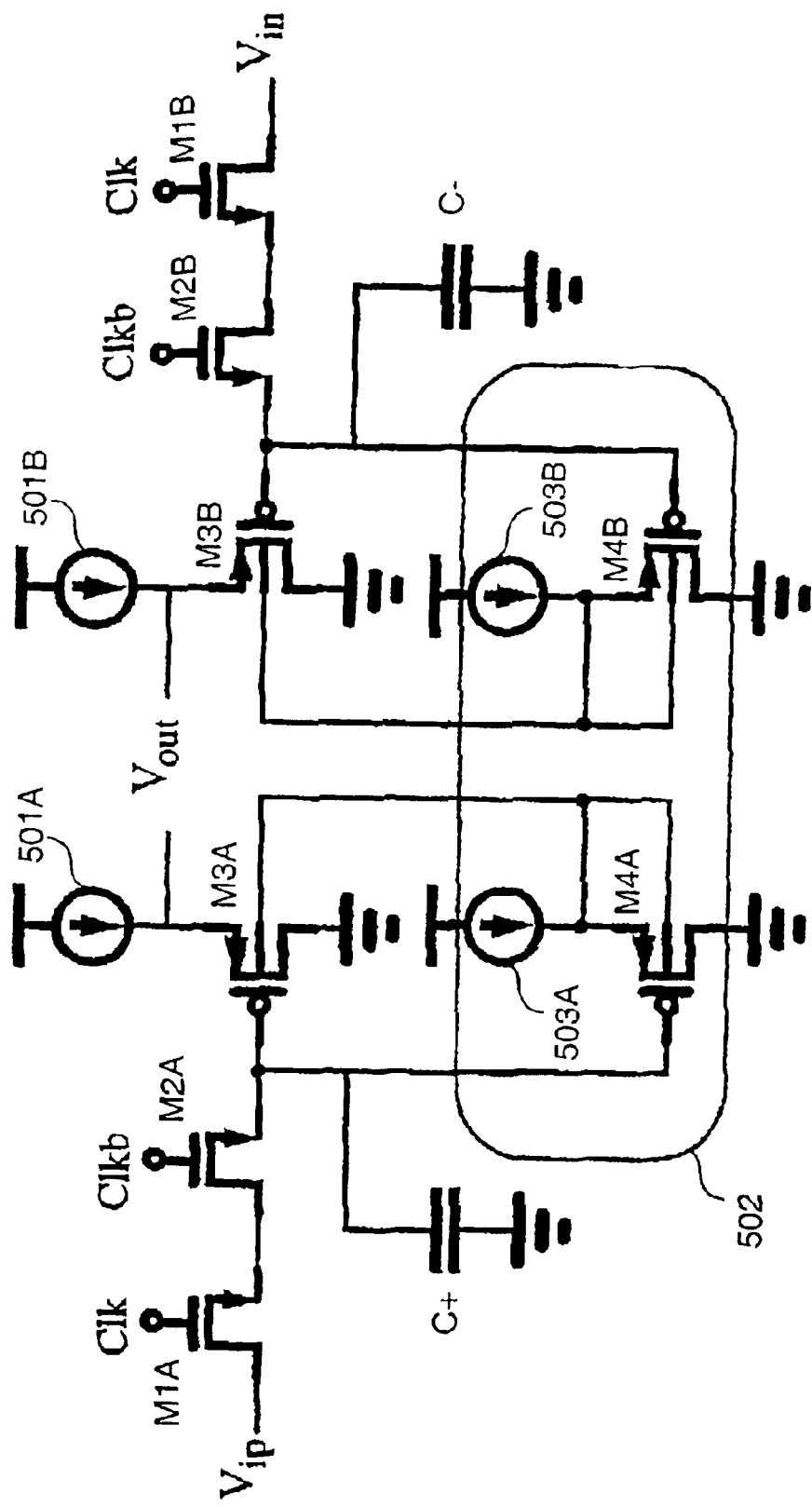
FIG. 5 illustrates an alternative track and hold amplifier structure of the present invention.

FIG. 5 illustrates an improved track and hold (T/H) amplifier that may be used in an analog-to-digital converter of the present invention. To enable the high speed and low supply operation, only open-loop and common mode logic (CML) type circuits are incorporated in this design. For Gigahertz sampling rate, using a T/H becomes essential to achieve the desired dynamic performance with a wide-band input signal.

As may be seen in FIG. 5, the track and hold amplifier includes two transistors MIA, MIB driven by the CLK input, two transistors M2A, M2B driven by the CLKB input, two current sources 501A, 501B connected to sources of transistors M3A, M3B, respectively, and two input capacitors C+, C− (which are typically about 0.5 pF).

The source follower's size (M3A, M3B) is quite large in order to drive the preamplifier bank 101 (array 101). The big non-linear well capacitance of M3A, M3B limits the T/H output bandwidth and adds distortion.

To address the distortion due to the wells of M3A, M3B, a replica circuit of a main source follower, designated 502, is added to the conventional track and hold amplifier. The replica circuit 502 includes two current sources 503A, 503B, and two transistors M4A, M4B biased by the current sources 503A, 503B. The addition of the replica circuit 502 provides bias to the wells of the transistors M3A, M3B, substantially reducing the nonlinearity effects that exist due to the bulk (substrate) connections of the transistors M3A, M3B. Replica circuit 502 tracks the source voltage of the main source follower and provides biasing to the wells of M3A, M3B. The replica circuit is about 5% of the main source follower size.

Figure 6:
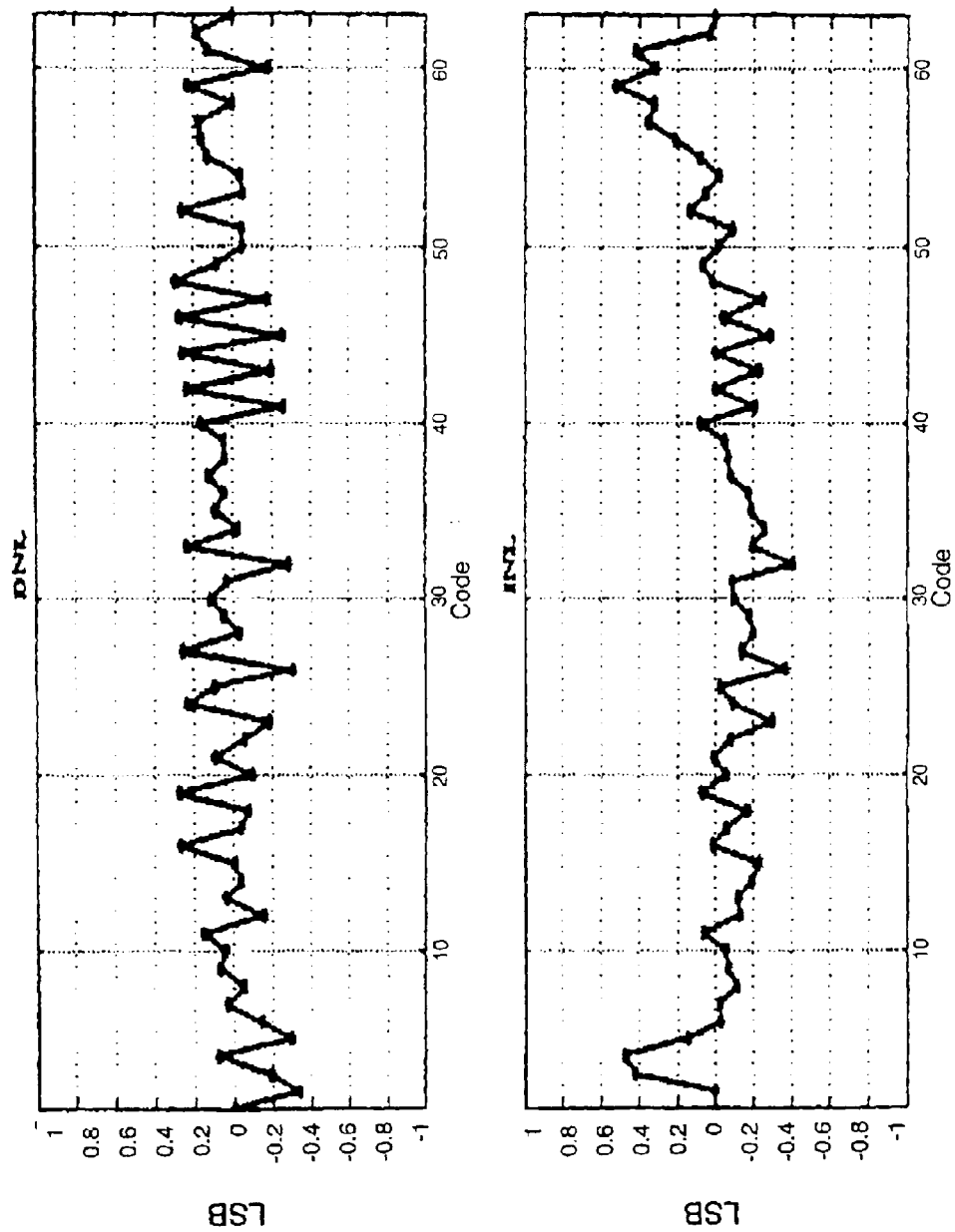
FIG. 6 illustrates the nonlinearity performance when using the approaches of FIGS. 3 and 4A.

FIG. 6 illustrates the advantages of the embodiments shown in FIGS. 3 and 4B. As may be seen from the differential nonlinearity (DNL) graph of FIG. 6, the differential nonlinearity is under 0.3 LSB (least significant bit). Without the use of the circuits of FIGS. 3 and 4B, the DNL would be on the order of 5 LSB. Similarly, the integral nonlinearity (INL) is generally under 0.5 LSB, substantially lower than the numbers seen in conventional circuits. (The X axis represents to the digital codes, i.e., for a six-bit analog-to-digital converter, there are 64 digital codes, or 0–63.) In other words, through the use of the circuits illustrated in FIGS. 3 and 4B, the nonlinearity is reduced by an order of magnitude.

Figure 7:
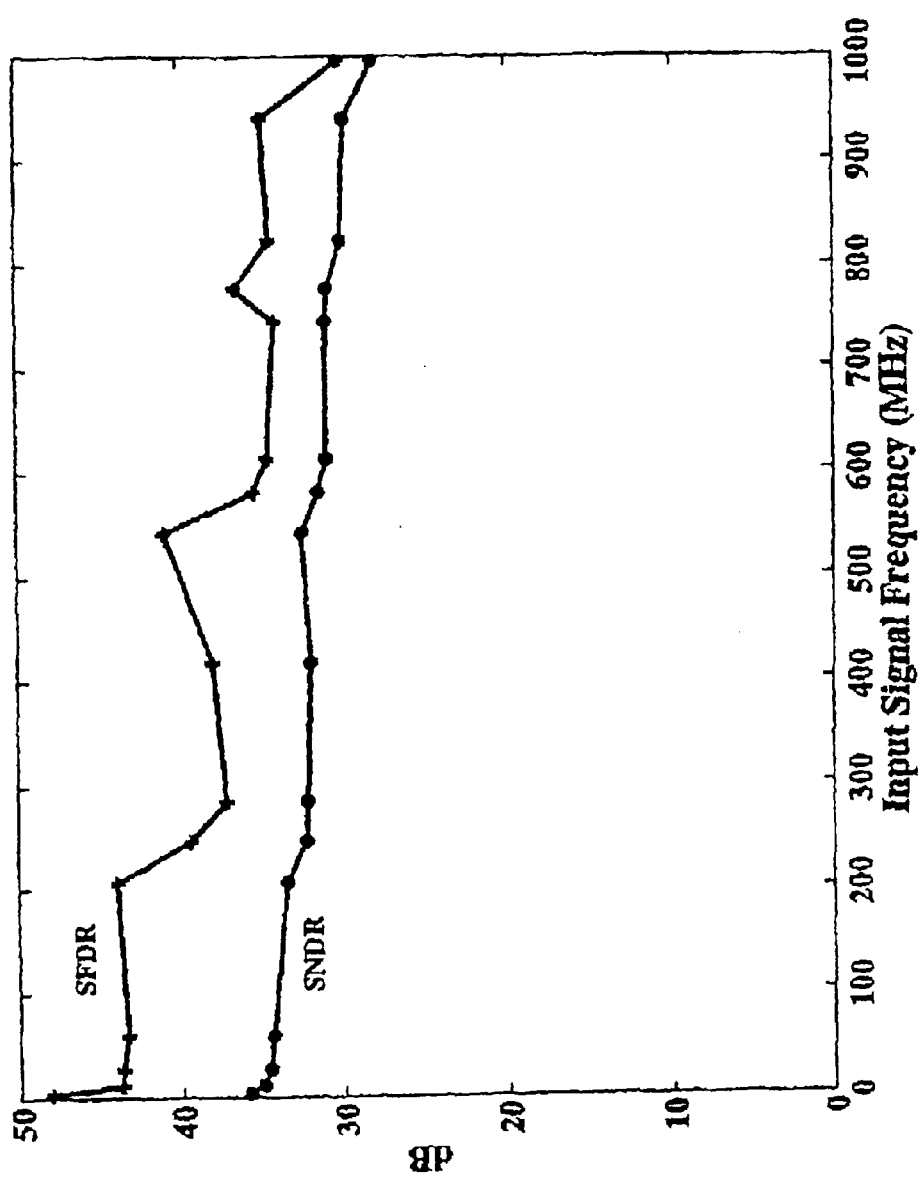
FIG. 7 illustrates dynamic performance using the track and hold amplifier of FIG. 5.

FIG. 7 illustrates dynamic performance achievable with the track and hold amplifier of FIG. 5. As may be seen from FIG. 7, the spurious free dynamic range (SFDR) and the signal-to-noise distortion ratio (SNDR) are extremely good all the way up to input frequencies of 1 GHz. Without the track and hold amplifier of FIG. 4, the performance would be about 15–20 dB worse than that shown in FIG. 7.

Figure 8:
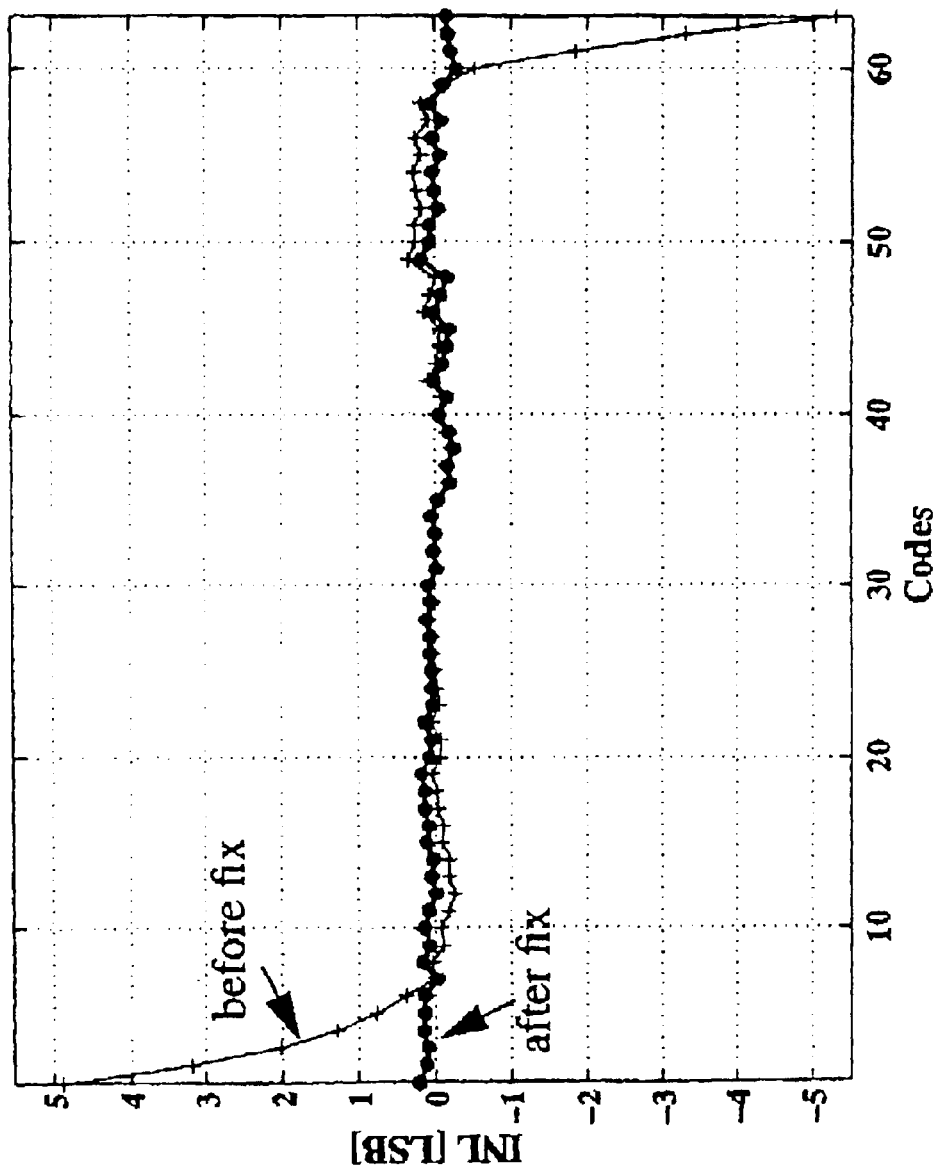
FIG. 8 illustrates the improvement and the edge effect when using the circuits illustrated in FIGS. 3 and 4B.

FIG. 8 shows the improvement in the integral nonlinearity (INL) at the edges of the amplifier array 101 using the circuits illustrated in FIGS. 3 and 4B. As may be seen in FIG. 8, while the performance is only somewhat better in the center of the array (i.e., digital codes ranging from about 7 to about 60), there is a dramatic improvement at the edges, i.e., codes 61–63 and codes 0–6.

Figure 9:
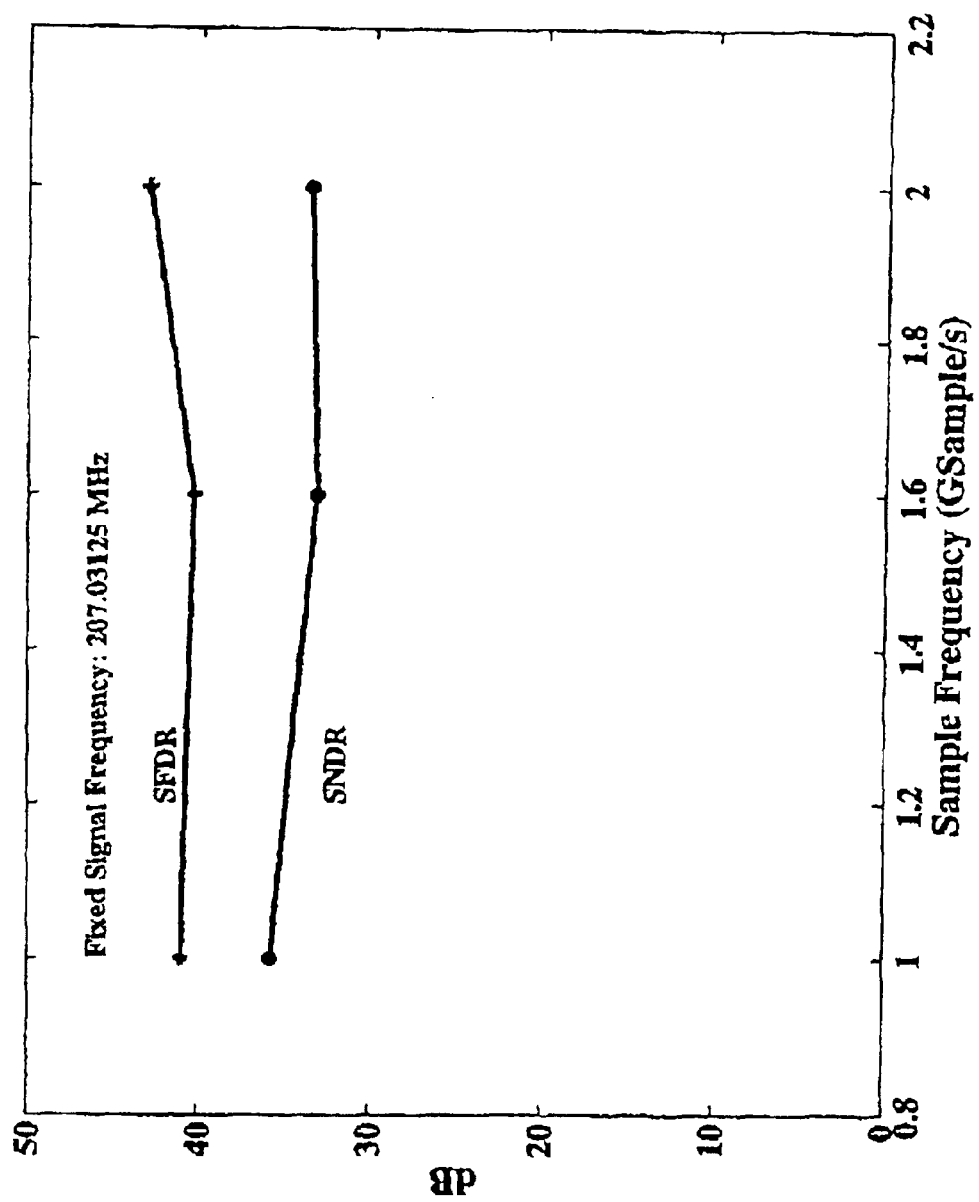
FIG. 9 illustrates dynamic performance of an ADC with the circuit of FIG. 5.

FIG. 9 illustrates the dynamic performance of an analog-to-digital converter using the track and hold amplifier of FIG. 5. As may be seen from FIG. 9, which shows SFDR and SNDR as a function of sampling frequency $f_s$, the dynamic performance is dramatically better, by about 15–20 dB, all the way up to approximately 2 Giga-samples per second.

Figure 10:
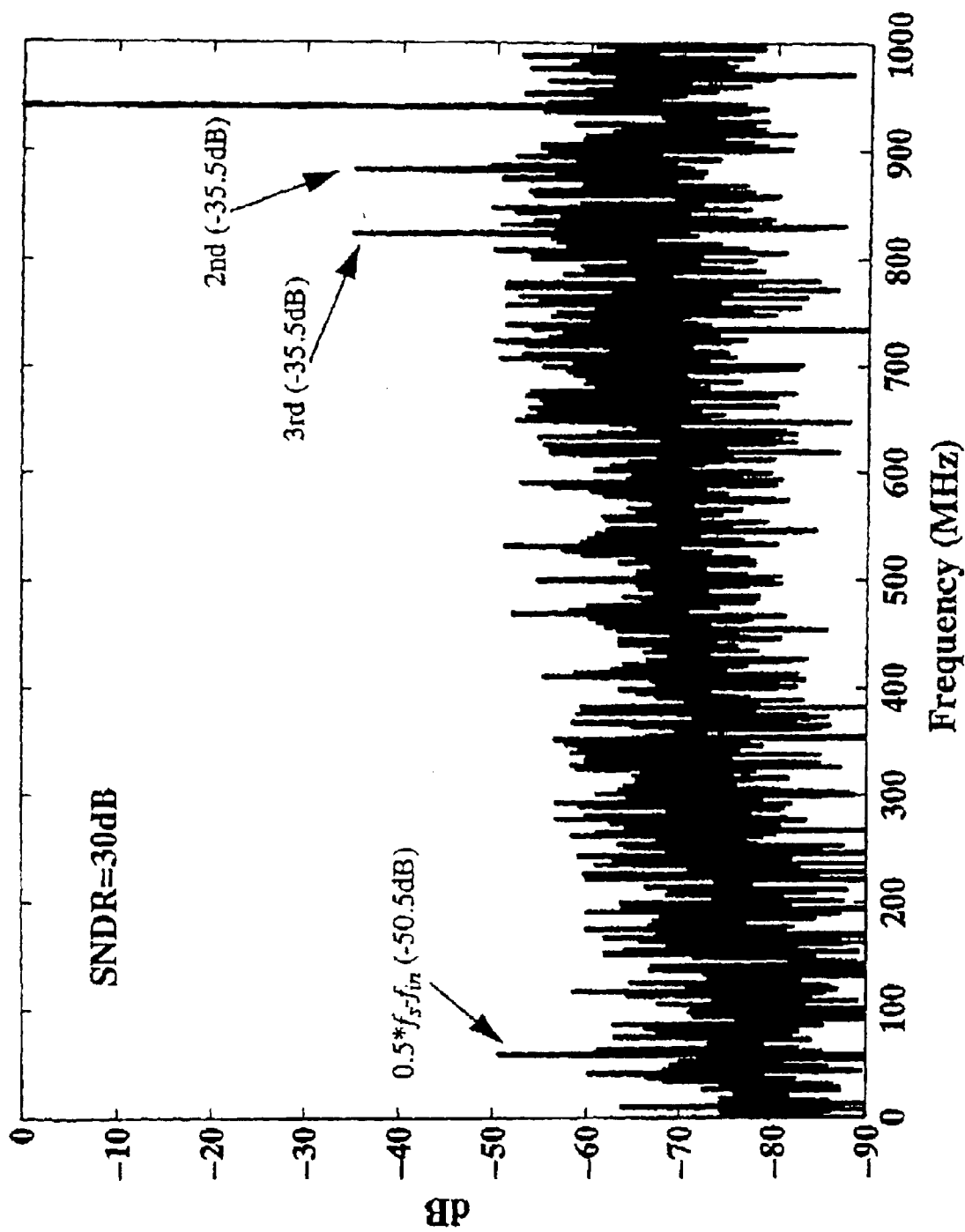
FIG. 10 illustrates overall system performance using the circuits shown in FIGS. 3, 4B and 5.

FIG. 10 illustrates overall system performance using the track and hold amplifier of FIG. 5, together with the interface amplifiers of FIG. 3 and the controllable current sources 402 of FIG. 4B. As may be seen in FIG. 10, the overall system performance is extremely good all the way to signal frequencies of close to 1 GHz.

The simulated INL profiles of the amplifier array 101 reduce peak INL from 5 LSB before fixing boundary problem to 0.3 LSB after fixing it. Three hundred times Monte-Carlo simulations show sigmas of the input referred offset at the array center and array edge are 1.37 mV and 1.41 mV respectively, which implies even averaging is achieved with the method of triple cross-connections and pre-distorting reference voltage.

Time-interleaving technology is often used to reduce the bandwidth requirements on individual amplifiers (except the front-end track and hold (T/H) still need full tracking bandwidth), and increases the data throughput with lower speed clocking. One advantage is that it can also save the power consumption in the system. The required gain to suppress the dynamic offset from the amplifier array is evenly distributed between preamplifier stages in a multi-stage ADC to maximize the bandwidth.

Fabricated in a 0.18 μm 1P6M CMOS technology, the prototype ADC occupies an active area of 0.5 mm². A clock amplifier and high speed digital buffers are integrated. A 50-Ohm on-chip termination for a 0.8 Volt differential clock helps to reduce the reflection. CMOS level data and clock directly drive Agilent logic analyzer 16702B, which has 1 GHz state mode and 4 GHz timing mode.

Instead of being mounted in a conventional package, the prototype of A/D converter was mounted on a printed circuit board with chip-on-board technology. Including front-end T/H and clock buffers, the circuits consume 310 mW from 1.8V at a 2-GHz conversion rate and 996 MHz input. The measured linearities are shown in FIG. 6. The peak DNL and INL are 0.32 LSB and 0.5 LSB respectively. FIG. 7 shows the measured SNDR and SFDR as function of input signal frequency. The effective resolution bandwidth reaches 1 GHz. This ADC achieves a state-of-the-art Figure-of-Merit of 3.5 pJ defined by (Power)/$2^{ENOB}$·2·ERBW), where ENOB is effective number of bits, and ERBW is effective resolution bandwidth.

It will be understood by those skilled in the art that various changes in form and details may be made therein without departing from the spirit and scope of the invention as defined in the appended claims. Thus, the breadth and scope of the present invention should not be limited by any of the above-described exemplary embodiments, but should be defined only in accordance with the following claims and their equivalents.

What is claimed is:

1. An analog to digital converter comprising:
   an array of differential input amplifiers, each inputting an input voltage and a corresponding voltage reference, and outputting a differential signal representing a comparison of the input voltage and the corresponding voltage reference;
   a plurality of latches storing the differential signal from each of the differential input amplifiers;
   a decoder converting the stored differential signals to N-bit digital output;
   a first interface amplifier connected to a first edge amplifier of the array through a first cross point; and
   a second interface amplifier connected to a second edge amplifier of the array through a second cross point,
   wherein the first interface amplifier and the second interface amplifier are connected to each other through a third cross point.

2. The analog to digital converter of claim 1, wherein positive and negative outputs of each differential input amplifier of the array are connected to respective outputs of a neighboring differential input amplifier through corresponding resistors.

3. The analog to digital converter of claim 1, wherein positive and negative outputs of each interface amplifier are connected to respective outputs of the same polarity of a corresponding edge amplifier through corresponding resistors.

4. The analog to digital converter of claim 1, wherein a positive output of the first interface amplifier is connected to a negative output of the second interface amplifier through a first resistor.

5. The analog to digital converter of claim 4, wherein a negative output of the first interface amplifier is connected to a positive output of the second interface amplifier through a second resistor.

6. The analog to digital converter of claim 1, further including a track and hold amplifier inputting a differential input signal and outputting the input voltage to the array, the track and hold amplifier comprising:

a first transistor pair driven by a clk signal at their gates;

a second transistor pair driven by a clkb signal at their gates;

a third transistor pair inputting the differential input signal at their gates through the first and second transistor pair, and having their sources biased by corresponding current sources; and a replica circuit connected to the gates of the third transistor pair and to substrates of the third transistor pair for biasing wells of the third transistor pair so as to reduce nonlinear well behavior.

7. The analog to digital converter of claim 1, further comprising:

a reference ladder including a plurality of resistors and taps providing the voltage references; and at least one controllable current source in series with each tap for adjusting the voltage reference of the each tap.

8. An analog to digital converter comprising:

a reference ladder including a plurality of resistors and taps providing voltage references;

at least one controllable current source in series with each tap for adjusting the voltage reference of the each tap;

an array of differential input amplifiers, each inputting an input voltage and a corresponding voltage reference, and outputting a differential signal representing a comparison of the input voltage and the corresponding voltage reference;

a plurality of latches storing the differential signal from each of the differential input amplifiers;

a decoder converting the stored differential signals to N-bit digital output; and a zero crossing generator that inputs the voltage references and outputs them to the array.

9. An analog to digital converter comprising:

a reference ladder including a plurality of resistors and taps providing voltage references;

at least one controllable current source in series with each tap for adjusting the voltage reference of the each tap;

an array of differential input amplifiers, each inputting an input voltage and a corresponding voltage reference, and outputting a differential signal representing a comparison of the input voltage and the corresponding voltage reference;

a plurality of latches storing the differential signal from each of the differential input amplifiers;

a decoder converting the stored differential signals to N-bit digital output; and a second controllable current source for the each tap, and connected between the tap and a supply rail.

10. A track and hold amplifier inputting a differential input signal and outputting a clocked input signal comprising:

a first transistor pair driven by a clk signal at their gates;

a second transistor pair driven by a clkb signal at their gates;

a third transistor pair inputting the differential input signal at their gates through the first and second transistor pair, and having their sources biased by corresponding current sources; and a replica circuit connected to the gates of the third transistor pair and to substrates of the third transistor pair for biasing wells of the third transistor pair so as to reduce nonlinear well behavior.

11. The track and hold amplifier of claim 10, wherein the replica circuit includes a fourth pair of transistors whose sources are biased by corresponding replica current sources, and wherein the sources of the fourth pair of transistors are connected to the corresponding substrates of the third transistor pair and to substrates of their own transistors.

12. A track and hold amplifier comprising:

a first transistor pair controlled by a clock signal;

a second transistor pair controlled by an inverted clock signal;

a third transistor pair inputting a differential input signal through the first and second transistor pair, and biased by corresponding current sources; and a replica circuit connected to the third transistor pair and to substrates of the third transistor pair for biasing wells of the third transistor pair.

13. The track and hold amplifier of claim 12, wherein the replica circuit includes a fourth pair of transistors whose sources are biased by corresponding replica current sources, and wherein the sources of the fourth pair of transistors are connected to the corresponding substrates of the third transistor pair and to substrates of their own transistors.

14. The track and hold amplifier of claim 13, wherein the replica circuit reduces nonlinear well behavior.

* * * * *